(12) United States Patent
Zhao et al.

(10) Patent No.: US 10,101,601 B2
(45) Date of Patent: Oct. 16, 2018

(54) BROKEN LINE REPAIR METHOD OF TFT SUBSTRATE

(71) Applicant: Shenzhen China Star Optoelectronics Technology Co., Ltd., Shenzhen (CN)

(72) Inventors: He Zhao, Shenzhen (CN); Kecheng Xie, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 168 days.

(21) Appl. No.: 15/117,453

(22) PCT Filed: Jun. 20, 2016

(86) PCT No.: PCT/CN2016/086437
§ 371 (c)(1),
(2) Date: Aug. 9, 2016

(87) PCT Pub. No.: WO2017/193454
PCT Pub. Date: Nov. 16, 2017

(65) Prior Publication Data
US 2018/0088365 A1    Mar. 29, 2018

(30) Foreign Application Priority Data
May 11, 2016 (CN) .......................... 2016 1 0311548

(51) Int. Cl.
*G02F 1/13* (2006.01)
*G02F 1/1368* (2006.01)
(Continued)

(52) U.S. Cl.
CPC .......... *G02F 1/1309* (2013.01); *G02F 1/1368* (2013.01); *G02F 1/136259* (2013.01);
(Continued)

(58) Field of Classification Search
None
See application file for complete search history.

(56) References Cited

U.S. PATENT DOCUMENTS 4,900,695 A * 2/1990 Takahashi ............. H01L 21/768
250/492.2
5,498,573 A * 3/1996 Whetten ............... G02F 1/1368
257/59
(Continued)

FOREIGN PATENT DOCUMENTS

CN          104765170      *   7/2015

*Primary Examiner* — Ryan Crockett
(74) *Attorney, Agent, or Firm* — Leong C. Lei

(57) ABSTRACT

The present invention provides a broken line repair method of a TFT substrate. The method first finds out a broken line in the TFT substrate and a position of a broken point on the broken line. Then, positions of the passivation layer intersecting with the broken line at two ends of the broken point are processed, respectively to expose a metal layer, where the broken line is. Then, a temporary material layer is covered on the passivation layer and the metal layer which is exposed at the two ends of the broken point. Finally, a metal growing film is formed on the temporary material layer to connect the broken line of the two ends of the broken point. With the temporary material layer, the issue of bad repair result due to the remain of the color resist layer and the folding of the passivation layer can be solved.

18 Claims, 13 Drawing Sheets

(51) Int. Cl.
*H01L 21/768* (2006.01)
*H01L 21/786* (2006.01)
*H01L 21/82* (2006.01)
*H01L 27/12* (2006.01)
*G02F 1/1362* (2006.01)

(52) U.S. Cl.
CPC .......... *H01L 21/768* (2013.01); *H01L 21/786* (2013.01); *H01L 21/82* (2013.01); *H01L 27/12* (2013.01); *G02F 2001/136263* (2013.01)

(56) References Cited

U.S. PATENT DOCUMENTS

| | | | | |
|---|---|---|---|---|
| 5,600,460 | A * | 2/1997 | Yamamoto | G02F 1/1309 349/139 |
| 2002/0018176 | A1* | 2/2002 | Kobayashi | G02F 1/13458 349/200 |
| 2007/0002198 | A1* | 1/2007 | Yang | G02F 1/136286 349/43 |
| 2011/0194041 | A1* | 8/2011 | Cheng | G02F 1/136259 349/38 |
| 2016/0103262 | A1* | 4/2016 | Kashiwagi | G02B 6/005 362/607 |

\* cited by examiner

BROKEN LINE REPAIR METHOD OF TFT SUBSTRATE

FIELD OF THE INVENTION

The present invention relates to a display technology field, and more particularly to a broken line repair method of a TFT substrate.

BACKGROUND OF THE INVENTION

The Liquid Crystal Display (LCD) is one of the most widely utilized flat panel displays, and the liquid crystal display panel is the core component of the Liquid Crystal Display.

The traditional liquid crystal panel generally comprises a Color Filter (CF), a Thin Film Transistor Array Substrate (TFT Array Substrate) and a Liquid Crystal Layer positioned inbetween. The working principle is that the liquid crystal molecules are positioned between the two parallel glass substrates, and many vertical and horizontal tiny little electrical lines are between the two glass substrates, and the light of backlight module is reflected to generate images by applying driving voltages or not for controlling the direction changes of the liquid crystal molecules. The thin film transistor (TFT) array manufactured on the thin film transistor array substrate is employed to drive the liquid crystal to rotate to control the display of each pixel. The color filter substrate comprises color filter layers, which is employed for forming colors of each pixel. The color filter layer comprises a red color resist, a green color resist and a blue color resist which are alternately aligned.

The broken line of the TFT substrate is the phenomenon that the broken point appears to the drive line or the signal line in the liquid crystal display panel caused by the process defect of the TFT substrate, and then some pixels always appear in the bright state as the liquid crystal display shows images. Because the broken line appears due to the process defect of the TFT substrate, the broken line ratio can never be decreased to be 0 by improving the production process, which is the inevitable defect in the liquid crystal display. The quality of the liquid crystal display with the broken line is poor. Once the broken line is found in the procedure of shipping out, the liquid crystal display has to be wasted, and the production cost increases. For diminishing the waste amount and reducing the production cost, the broken line detection is performed to the TFT substrate after the manufacture process of the TFT substrate is accomplished according to prior art, and the checked out broken line is repaired.

Please refer to FIG. 1 and FIG. 2, which are structure diagram and sectional diagram of the repair position of the TFT substrate after repair according to the TFT broken line repair method of prior art. The TFT broken line repair method arranges the repair structure in the sub pixel region adjacent to the broken point 21' of the broken line 20', and first, removing a portion of the color resist layer 600' of the sub pixel region adjacent to the broken point 21' which is on the passivation layer 500' to form a color resist groove 610' which is capable of connecting the two ends of the broken point 21', and then laser welding the two ends of the broken point 21' to remove the passivation layer 500' or the passivation layer 500' and the insulation layer 300' at two ends of the broken point 21' in the broken line 20', and then, employing the laser chemical vapor deposition (Laser CVD) to form the metal growing film 700' in the color resist groove 610' to connected the broken line 20', and next, making dark point in the sub pixel region where the color resist groove 610' is to accomplish the repair of the TFT broken line. When this repair method of broken line performs color resist remove, if the energy of removing the color resist is too small, the color resist remains on the passivation layer 500', and if the energy of removing the color resist is too large, the folding is formed on the passivation layer 500', which ultimately result in the local small of the metal growing film 700' and the poor adhesion result of the metal growing film 700' and the passivation layer 500'. It can easily cause the risk of broken line and Peeling to the metal growing film 700' and reduce the success ratio of the TFT broken line repair.

SUMMARY OF THE INVENTION

An objective of the present invention is to provide a broken line repair method of a TFT substrate, which can promote the adhesion result and uniformity of the metal growing film, and reduce the risks of the broken lines and peeling off of the metal growing film to raise the broken line repair success ratio of the TFT substrate to ensure the product quality and to promote the product competitiveness.

For realizing the aforesaid objectives, the present invention provides a broken line repair method of a TFT substrate, comprising steps of:

step 1, providing a TFT substrate;

wherein the TFT substrate comprises: a substrate, a first metal layer, which is patterned and located on the substrate, an insulation layer covering the substrate and the first metal layer, a second metal layer, which is patterned and located on the insulation layer, a passivation layer covering the insulation layer and the second metal layer;

step 2, finding out a broken line in the TFT substrate and a position of a broken point on the broken line;

step 3, processing positions of the passivation layer intersecting with the broken line at two ends of the broken point, respectively to expose a metal layer, where the broken line is;

step 4, covering a temporary material layer on the passivation layer and the metal layer which is exposed at the two ends of the broken point;

step 5, forming a metal growing film on the temporary material layer to connect the broken line of the two ends of the broken point.

Material of the temporary material layer in the step 4 is chromium, cadmium or tin.

The step 2 specifically comprises: putting the TFT substrate in an array test station for detection to find out the broken line in the TFT substrate and a position coordinate of the broken point on the broken line, and recording the coordinate of the broken point.

The step 3 specifically comprises: delivering the TFT substrate to a repair machine, and the repair machine finds the corresponding broken point according to the coordinate of the broken point; then processing the positions of the passivation layer intersecting with the broken line at two ends of the broken point by laser welding to expose the metal layer.

Material of the temporary material layer in the step 4 is resin acid material.

Material of the temporary material layer in the step 4 is $C_{19}H_{29}COOH$, and the temporary material layer constantly gasified along with formation of the metal growing film.

The step 4 specifically comprises: delivering the TFT substrate to a temporary material station to form the temporary material layer on the passivation layer and the metal layer.

the TFT substrate further comprises a color resist layer located on the passivation layer;

in the step 3, removing a portion of the color resist layer in an adjacent region of the broken point to form a color resist groove which can connect the two ends of the broken point on the broken line, and the color resist groove exposes the passivation layer under the color resist layer; processing the positions of the passivation layer intersecting with the broken line at the two ends of the broken point, respectively to expose the metal layer, where the broken line is;

the broken line repair method of the TFT substrate further comprises step 6, performing dark point process to a sub pixel region having the color resist groove.

In the step 4, covering the passivation layer and the metal layer exposed at the two ends of the broken point inside the color resist groove with the temporary material layer.

Specific steps of the dark point process in the step 6 are:

step 61, cutting a storage capacitor electrode line intersecting with the metal growing film in space to cut a connection between a source of the sub pixel region which needs the dark point process and the data line or a connection between a drain and a pixel electrode;

step 62, welding together the pixel electrode and the storage capacitor electrode line of the sub pixel region which needs the dark point process.

The present invention further provides a broken line repair method of a TFT substrate, comprising steps of:

step 1, providing a TFT substrate;

wherein the TFT substrate comprises: a substrate, a first metal layer, which is patterned and located on the substrate, an insulation layer covering the substrate and the first metal layer, a second metal layer, which is patterned and located on the insulation layer, a passivation layer covering the insulation layer and the second metal layer;

step 2, finding out a broken line in the TFT substrate and a position of a broken point on the broken line;

step 3, processing positions of the passivation layer intersecting with the broken line at two ends of the broken point, respectively to expose a metal layer, where the broken line is;

step 4, covering a temporary material layer on the passivation layer and the metal layer which is exposed at the two ends of the broken point;

step 5, forming a metal growing film on the temporary material layer to connect the broken line of the two ends of the broken point;

wherein the step 2 specifically comprises: putting the TFT substrate in an array test station for detection to find out the broken line in the TFT substrate and a position coordinate of the broken point on the broken line, and recording the coordinate of the broken point;

wherein the step 3 specifically comprises: delivering the TFT substrate to a repair machine, and the repair machine finds the corresponding broken point according to the coordinate of the broken point; then processing the positions of the passivation layer intersecting with the broken line at two ends of the broken point by laser welding to expose the metal layer.

The benefits of the present invention are: the present invention provides the broken line repair method of the TFT substrate. The method first finds out a broken line in the TFT substrate and a position of a broken point on the broken line. Then, positions of the passivation layer intersecting with the broken line at two ends of the broken point are processed, respectively to expose a metal layer, where the broken line is. Then, a temporary material layer is covered on the passivation layer and the metal layer which is exposed at the two ends of the broken point. Finally, a metal growing film is formed on the temporary material layer to connect the broken line of the two ends of the broken point. With the temporary material layer, the issue of bad repair result due to the remain of the color resist layer and the folding of the passivation layer can be solved to promote the adhesion result and uniformity of the metal growing film, and reduce the risks of the broken lines and peeling off of the metal growing film to raise the broken line repair success ratio of the TFT substrate.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 3:
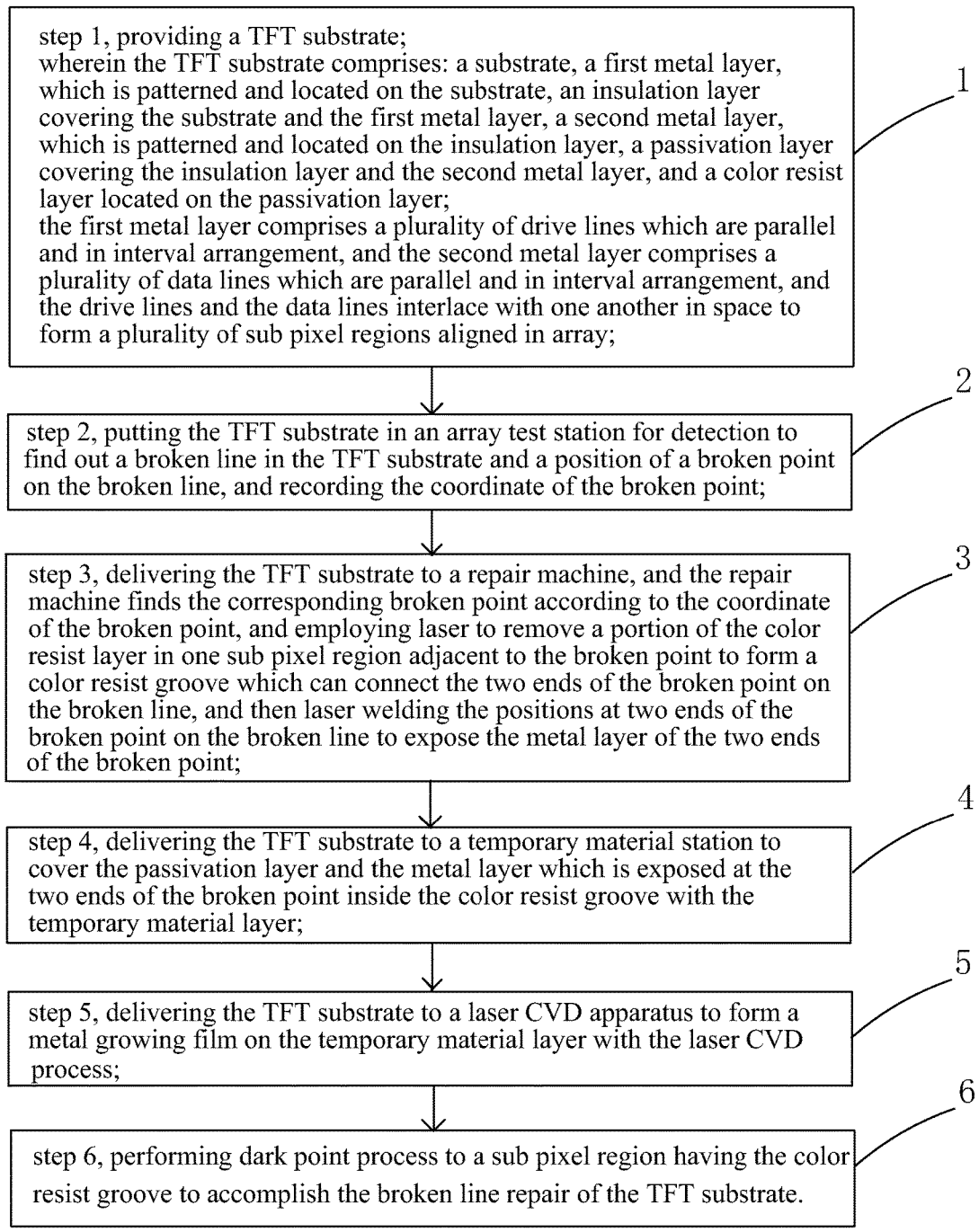
FIG. 3 is a flowchart of repairing the broken line in the TFT substrate display region with the broken line repair method of the TFT substrate according to the present invention.
Figure 4:
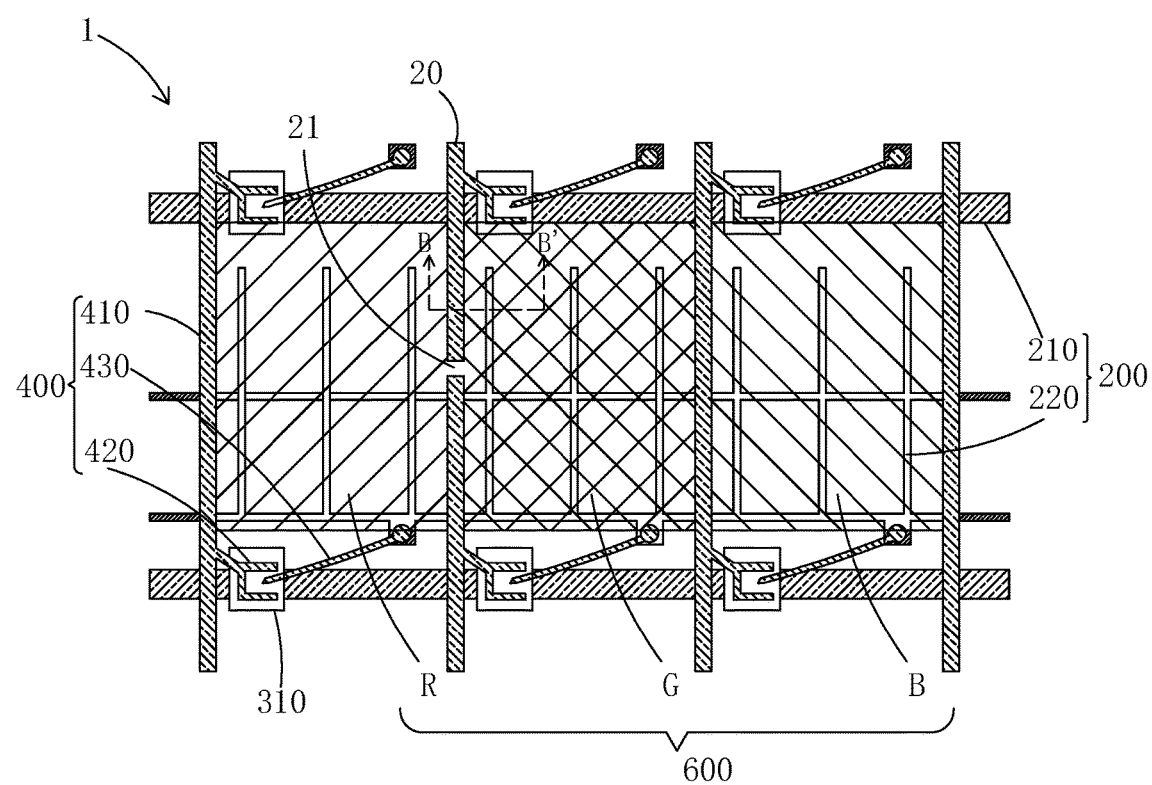
FIG. 4 is a diagram of the step 1 in the flowchart shown in FIG. 3.
Figure 5:
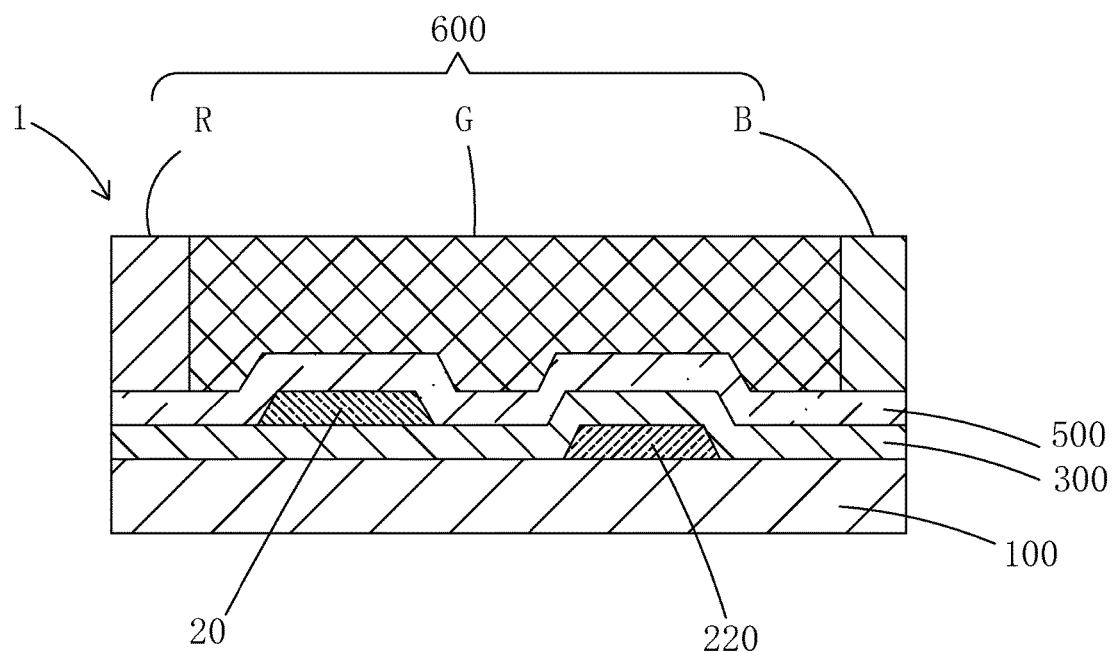
FIG. 5 is a sectional diagram corresponding to the B-B' position in FIG. 4.
Figure 14:
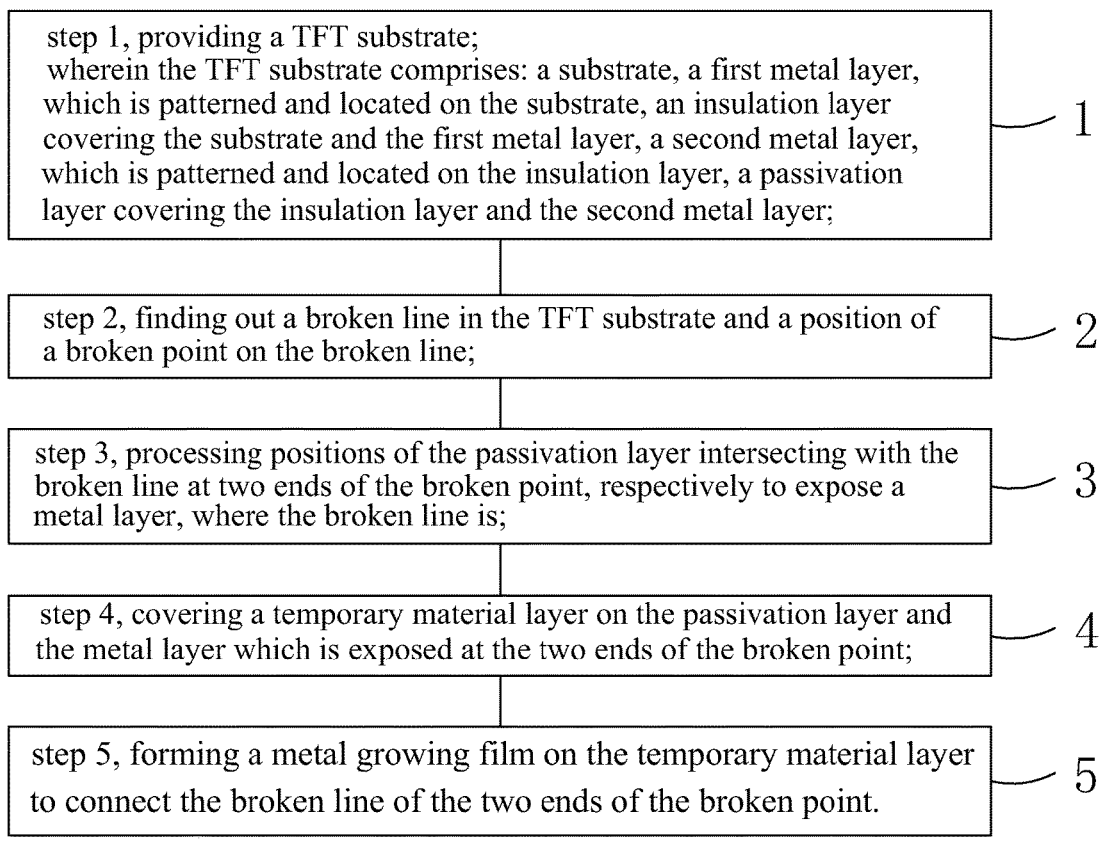
FIG. 14 is a flowchart of the broken line repair method of the TFT substrate according to the present invention.

Please refer to FIG. 14 combining FIG. 3, the present invention provides a broken line repair method of a TFT substrate. When the method is applied to repair the broken line in the display region of the TFT substrate, the method comprises steps of:

step 1, referring to FIG. 4 and FIG. 5, providing a TFT substrate 1 in which a broken line is to be repaired.

Specifically, the TFT substrate 1 comprises: a substrate 100, a first metal layer 200, which is patterned and located on the substrate 100, a gate insulation layer 300 covering the substrate 100 and the first metal layer 200, a second metal layer 400, which is patterned and located on the gate insulation layer 300, a passivation layer 500 covering the gate insulation layer 300 and the second metal layer 400, and a color resist layer 600 located on the passivation layer 500;

The first metal layer 200 comprises a plurality of drive lines 210 which are parallel and in interval arrangement, and the second metal layer 400 comprises a plurality of data lines 410 which are parallel and in interval arrangement, and the drive lines 210 and the data lines 410 interlace with one another in space to form a plurality of sub pixel regions aligned in array.

Furthermore, the first metal layer 200 in the step 1 further comprises: the storage capacitor electrode line (CST Line) 220 covering the respective sub pixel regions, and a plurality of gates (not shown) corresponding to the respective sub pixel regions aligned in array, and the plurality of gates are electrically coupled to the corresponding drive lines 210 in the sub pixel region where they are respectively are; the insulation layer 300 comprises a gate insulation layer and an interlayer insulation layer which stack up, and a plurality of semiconductor layers 310 is formed between the gate insulation layer above the gate and the interlayer insulation layer; the second metal layer 400 in the step 1 further comprises a plurality of sources 420 and drains 430 which respectively correspond to the respective sub pixels aligned in array, and the plurality of sources 420 and drains 430 respectively contact with two ends of the corresponding semiconductor layers 310, and the plurality of sources 420 are electrically coupled to the corresponding data lines 410 in the sub pixel region where they are respectively are; the TFT substrate 1 further comprises a plurality of pixel electrodes (not shown) which are located on the color resist layer 600 and formed to respectively correspond the respective sub pixel regions, and the plurality of pixel electrodes are electrically coupled to the corresponding drains 430 in the sub pixel region where they are respectively are.

Specifically, the gate, the semiconductor layer 310, the source 420 and the drain 430 commonly form the switch TFTs of the respective sub pixel regions to control the writing of the data signal. The source 420 and the drain 430 contact with the semiconductor layer 310 through the vias formed in the interlayer insulation layer, and the pixel electrode contacts with the drain 430 through the via formed in the color resist layer 600 and the passivation layer 500, and the pixel electrode and the storage capacitor electrode line 220 are insulation overlapping to form a storage capacitor. Preferably, material of the insulation layer 300 and the passivation layer 500 is Silicon Oxide, Silicon Nitride or a combination of the two, and material of the first metal layer 200 and the second metal layer 400 is aluminum or copper.

Specifically, the color resist layer 600 comprises color resists of various kinds of colors. Preferably, the color resist layer 600 in the step 1 comprises a red color resist R, a green color resist G and a blue color resist B which are alternately aligned in sequence. Certainly, the color resist layer 600 also can further comprise color resists of kinds of colors, such as a white color resist, a yellow resist in advance.

step 2, putting the TFT substrate 1 in an array test station for detection to find out a broken line 20 in the TFT substrate 1 and a position of a broken point 21 on the broken line 20, and recording the coordinate of the broken point 21.

Specifically, the coordinate of the broken point 21 is recorded in the corresponding repair system. The respective apparatuses can obtain the coordinate from the repair system to find the position of the broken point 21.

Specifically, the broken line 20 can be the drive line 210 or can be the data line 410.

step 3, delivering the TFT substrate 1 to a repair machine, and the repair machine finds the corresponding broken point 21 according to the coordinate of the broken point 21, and employing laser to remove a portion of the color resist layer 600 in one sub pixel region adjacent to the broken point 21 to form a color resist groove 610 which can connect the two ends of the broken point 21 on the broken line 20, and then laser welding the positions at two ends of the broken point 21 on the broken line 20 to expose the metal layer of the two ends of the broken point 21.

Figure 1:
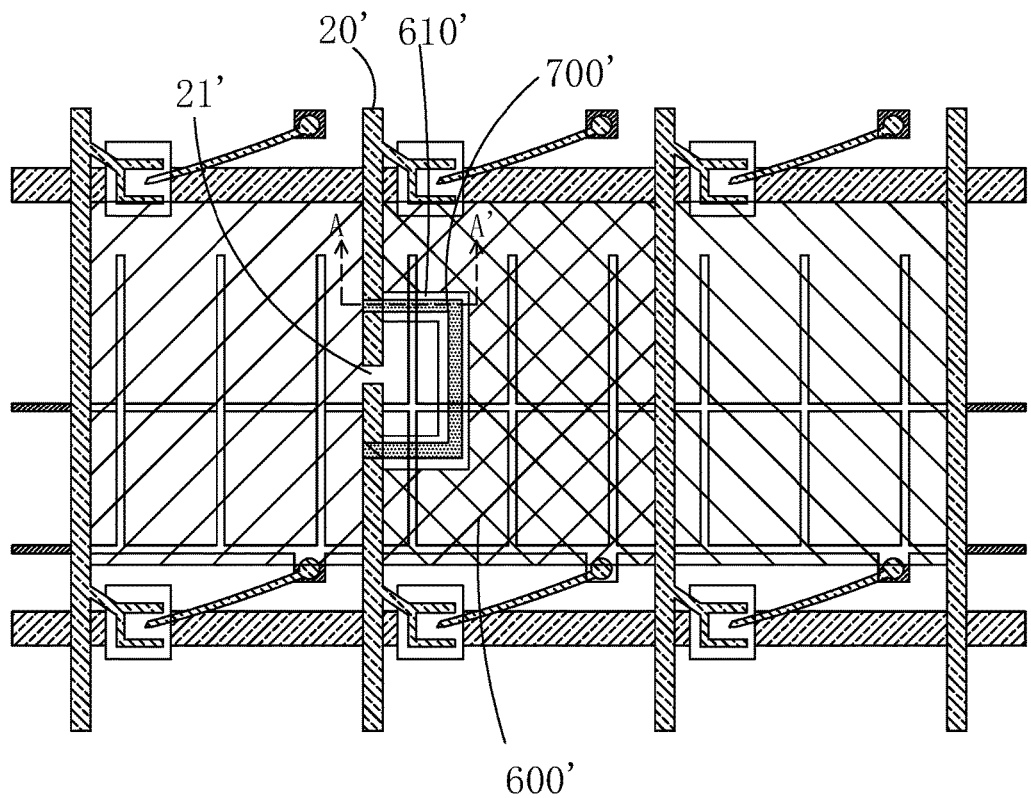
FIG. 1 is a structure diagram of the TFT substrate after repair with the broken line repair method of the TFT substrate according to prior art.
Figure 2:
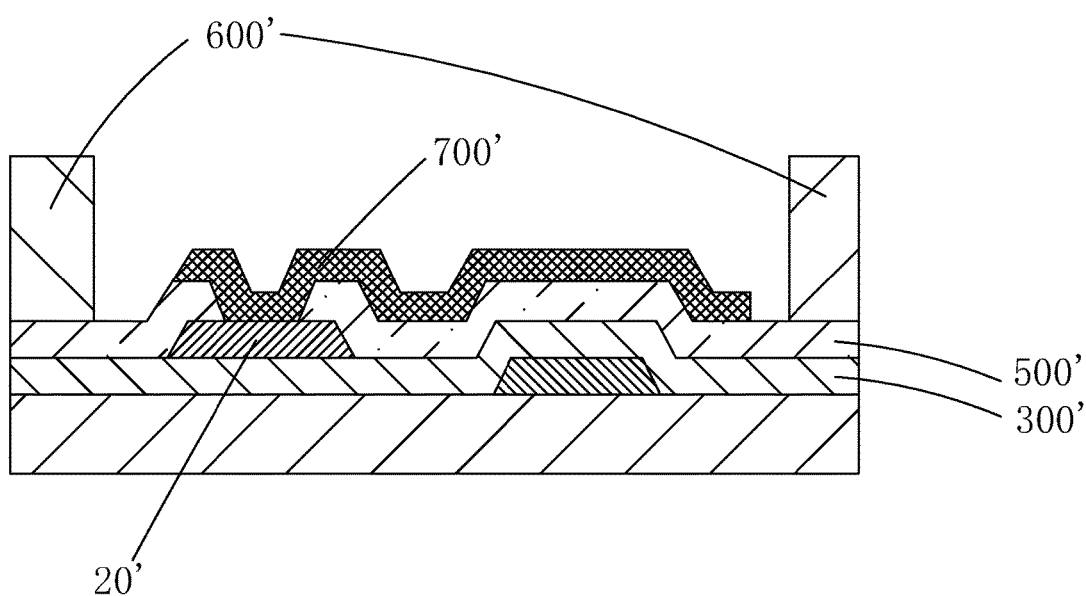
FIG. 2 is a sectional diagram corresponding to the A-A' position in FIG. 1.
Figure 6:
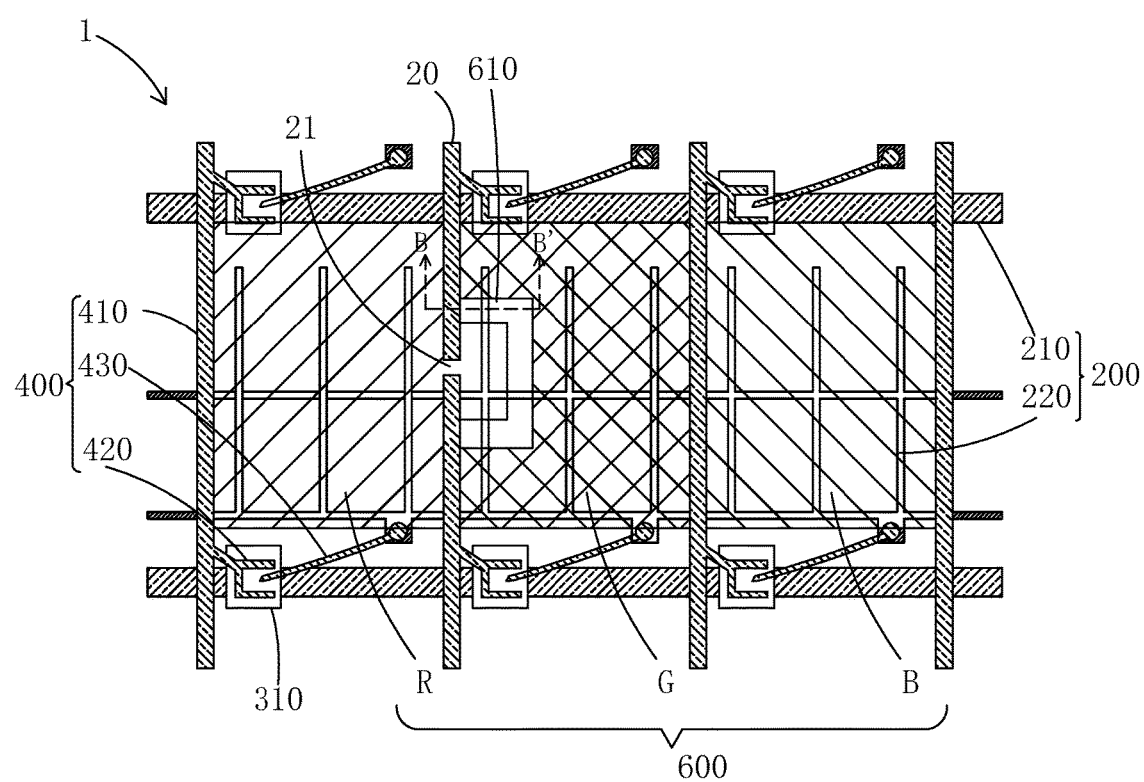
FIG. 6 is a diagram of the step 3 in the flowchart shown in FIG. 3.
Figure 7:
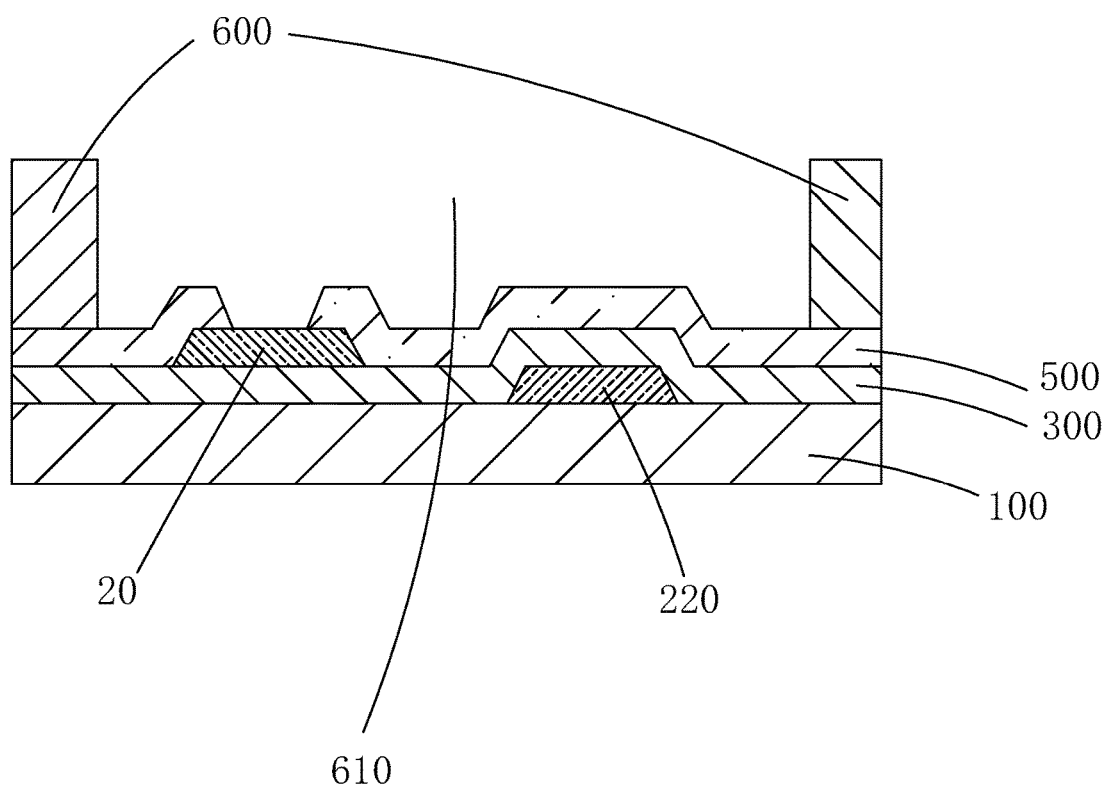
FIG. 7 is a sectional diagram corresponding to the B-B' position in FIG. 6.
Figure 8:
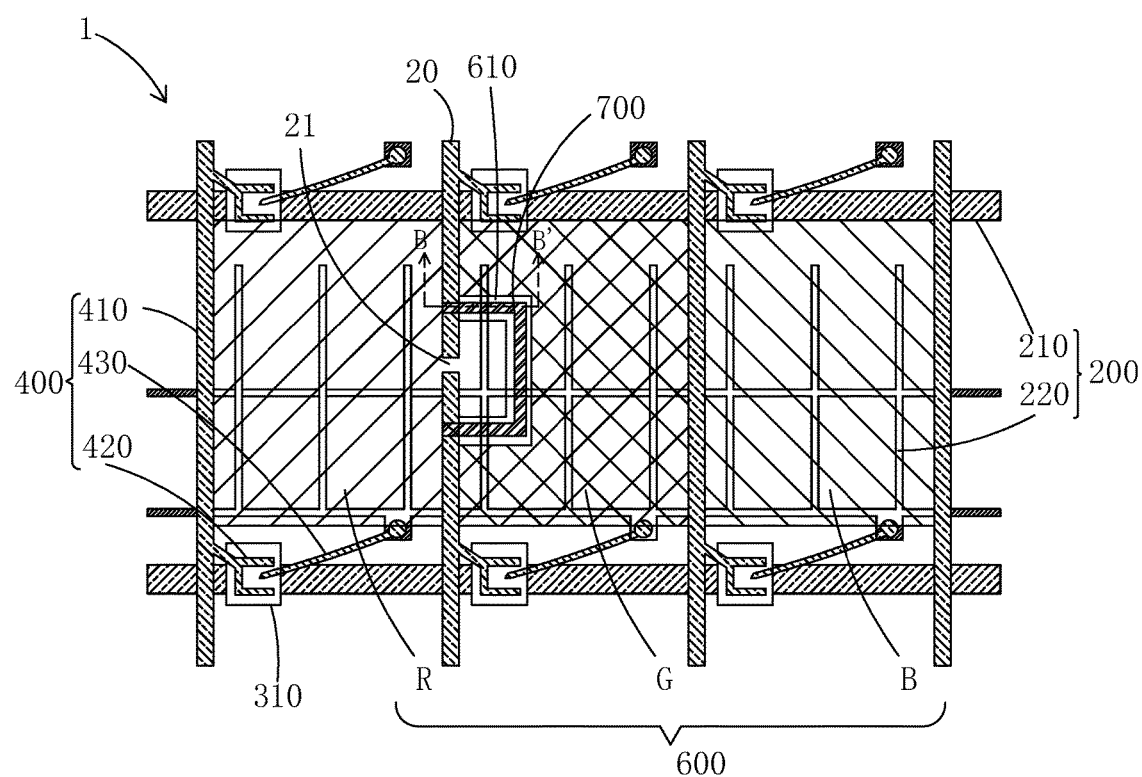
FIG. 8 is a diagram of the step 4 in the flowchart shown in FIG. 3.
Figure 9:
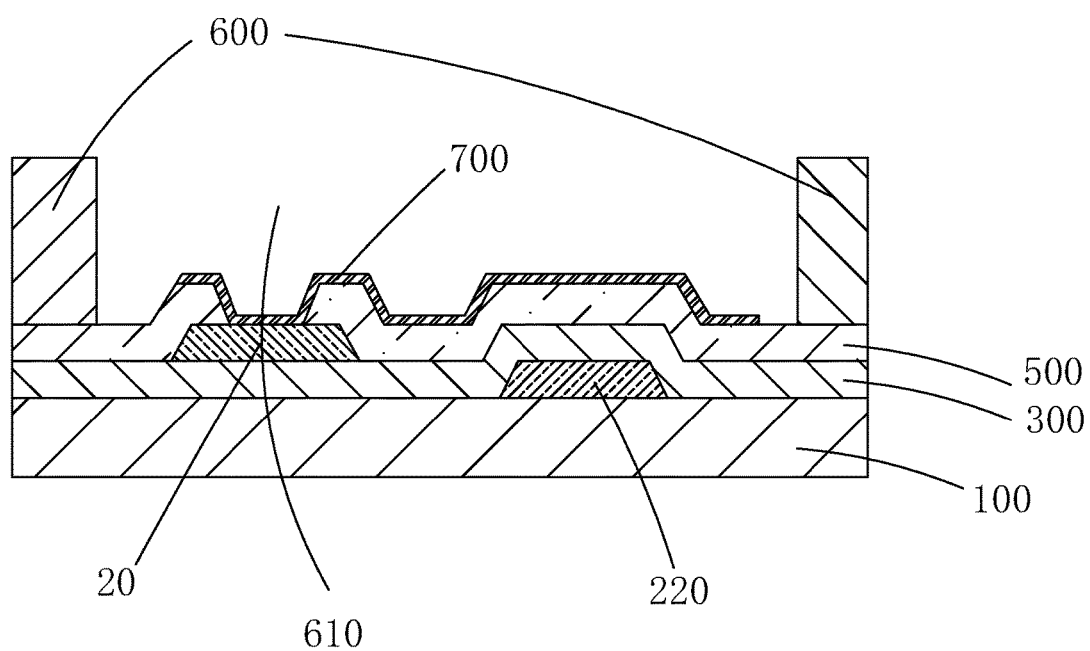
FIG. 9 is a sectional diagram corresponding to the B-B' position in FIG. 8.

Please refer to FIG. 6 and FIG. 7. When the broken line 20 is the data line 410, the passivation layer 500 of the two ends of the broken point 21 needs to be removed as laser welding. When the broken line 20 is the drive line 210, the passivation layer 500 and the insulation layer 300 of the two ends of the broken point 21 need to be removed as laser welding. Besides, what is removed in FIG. 1 is a portion of the color resist layer 600 in one sub pixel region at the right side of the broken point 21. The solution of removing a portion of the color resist layer 600 in one sub pixel region at the left side of the broken point 21 also can be utilized on demands.

step 4, referring to FIG. 8 and FIG. 9, delivering the TFT substrate 1 to a temporary material station to cover the passivation layer 500 and the metal layer which is exposed at the two ends of the broken point 21 inside the color resist groove 610 with the temporary material layer 700.

Specifically, material of the temporary material layer 700 can be metal with strong adhesive force, and preferably can be chromium, cadmium or tin. Material of the temporary material layer 700 can be resin acid material, and preferably can be $C_{19}H_{29}COOH$.

step 5, delivering the TFT substrate 1 to a laser CVD apparatus to form a metal growing film 800 on the temporary material layer 700 with the laser CVD process.

Figure 10:
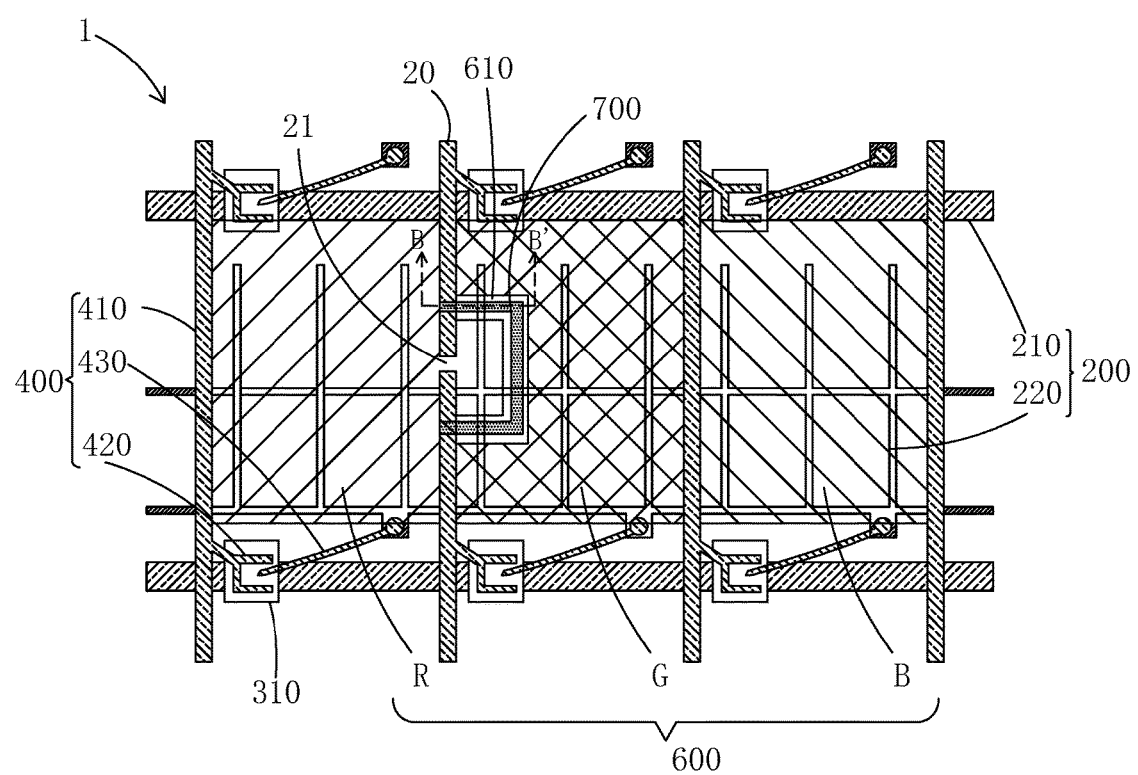
FIG. 10 is a diagram of the step 5 in the flowchart shown in FIG. 3.
Figure 11:
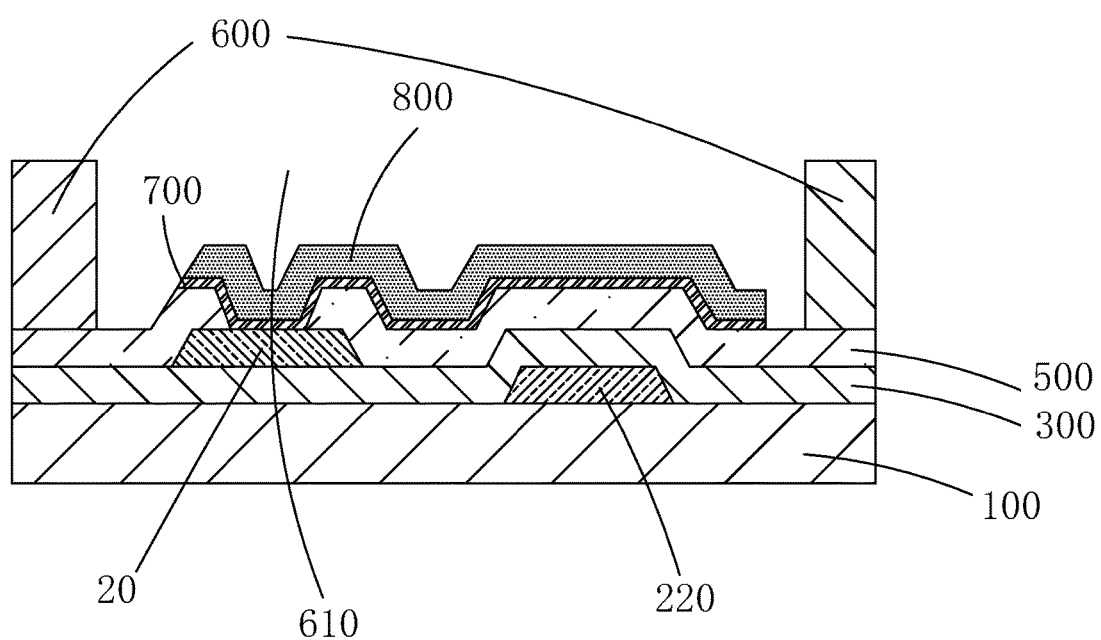
FIG. 11 is a sectional diagram of the B-B' position in FIG. 10 as the material of the temporary material layer is metal material.

Specifically, referring to FIG. 10 and FIG. 11, the temporary material layer 700 is the metal with strong adhesive force, the metal growing film 800 connects the two ends of the broken point 21 through temporary material layer 700 and laser holes at the two ends of the broken point 21 to connect the broken line 20 for normally transmitting signal to accomplish the repair of the broken line 20.

Specifically, because either of chromium, cadmium or tin has stronger adhesive force with metal and nonmetal, the temporary material layer 700 can fixedly adhered to the passivation layer 500 and the metal growing film 800 to promote the adhesion result of the metal growing film 800 on the passivation layer 500, which can effectively prevent the peeling off of the metal growing film 800; meanwhile, the temporary material layer 700 can fill the folding of the passivation layer due to that the energy of the repair machine for removing the color resist is too large and the remain of the color resist due to that the energy of removing the color resist is too small to make the adhesion surface of the metal growing film 800 flat. It can promote the uniformity of the metal growing film 800, and prevent the broken line caused by the local small of the metal growing film 800 to raise the broken line repair success ratio of the TFT substrate.

Figure 12:
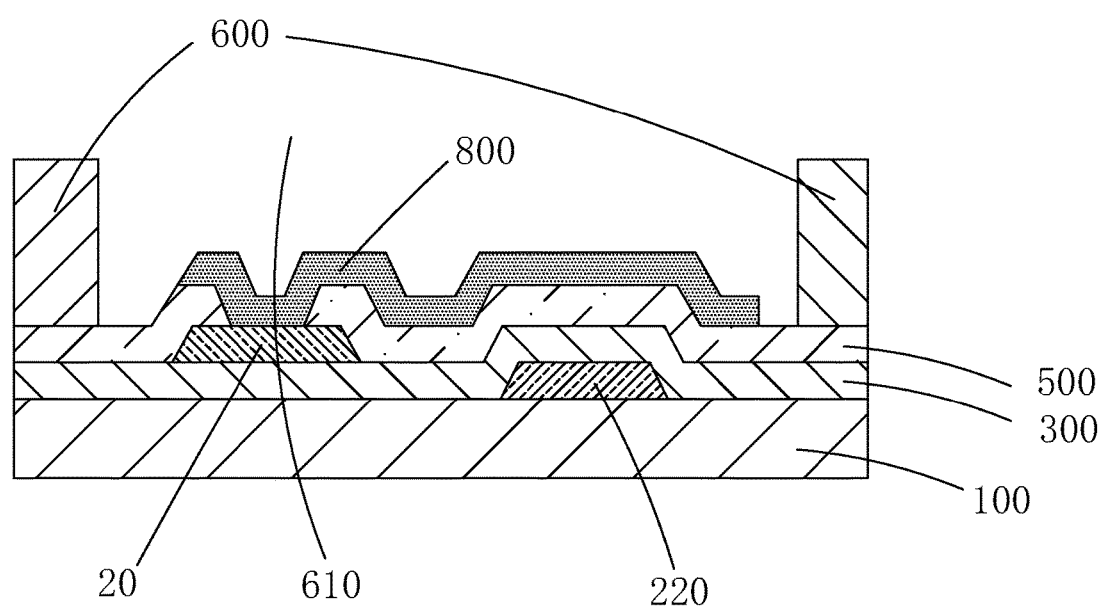
FIG. 12 is a sectional diagram of the B-B' position in FIG. 10 as the material of the temporary material layer is resin acid material.

Specifically, referring to FIG. 10 and FIG. 12, the temporary material layer 700 is the resin acid material. In the manufacture process of the metal growing film 800, it will release the heat to make the resin acid constantly gasified to make the temporary material layer 700 disappear. After the manufacture of the metal growing film 800 is accomplished, the metal growing film 800 connects the two ends of the broken point 21 through laser holes at the two ends of the broken point 21 to connect the broken line 20 for normally transmitting signal to accomplish the repair of the broken line 20.

Specifically, because the resin acid gasified, in the manufacture process of the metal growing film 800, the melt metal of forming the metal growing film 800 keeps to be deposited and levels during the gasifying process of the resin acid to make the metal molecules in the metal growing film 800 more compact to promote the adhesion result and uniformity of the metal growing film 800 on the passivation layer 500 to raise the broken line repair success ratio of the TFT substrate.

step 6, performing dark point process to a sub pixel region having the color resist groove 610 to accomplish the broken line repair of the TFT substrate.

Figure 13:
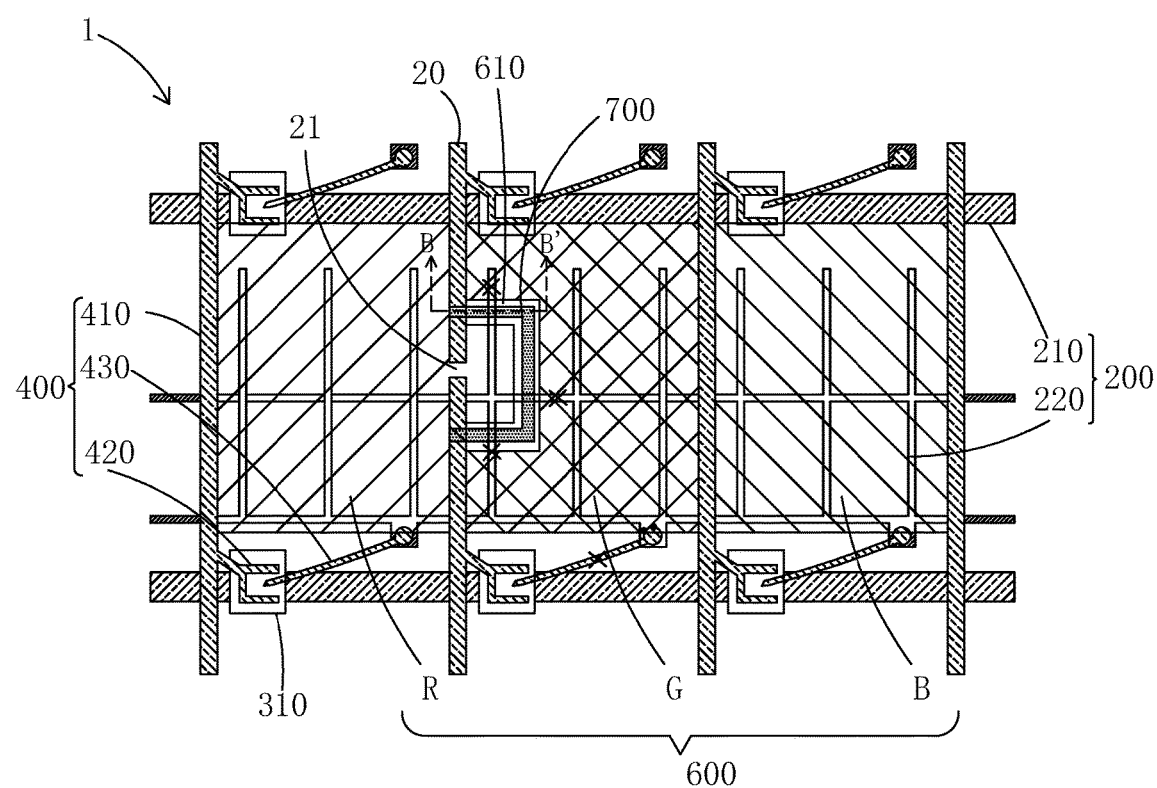
FIG. 13 is a diagram of the step 6 in the flowchart shown in FIG. 3.

Specifically, referring to FIG. 13, the step 6 specifically comprises:

step 61, cutting a storage capacitor electrode line 220 intersecting with the metal growing film 800 in space to prevent the short circuit of the metal growing film 800 and the storage capacitor electrode line 220.

Then, a connection between a source 420 of the sub pixel region which needs the dark point process and the data line 410 or a connection between a drain 420 and a pixel electrode is cut.

step 62, welding together the pixel electrode and the storage capacitor electrode line 220 of the sub pixel region which needs the dark point process to make the sub pixel region in a state of dark point.

Specifically, after the repair of the broken line 20 is accomplished, the recheck is performed to the TFT substrate 1. It can be shipped out once the repair is confirmed.

It can be understood that the repair method of adding the temporary material layer provided by the present invention also can be applied to the non display region or other similar positions:

first, the passivation region above the metal to be repaired is exposed by process. The processing ways comprises regular physic or chemical remove for the other structure above the passivation layer (corresponding to the color resist layer in the display region in the aforesaid embodiment) to expose the passivation layer which is approximately above the metal line broken point to be repaired, and the passivation layer here is also named the insulation layer;

then, laser welding is employed to process the passivation layer to expose the metal layer at the broken line in the position where the broken line to be repaired at the two end of the broken point intersects with the passivation layer;

finally, the metal layer exposed at the passivation layer and the two ends of the broken point is covered with the temporary material layer 700 and the metal growing film 800 so that the broken line to be repaired at the two end of the broken point recovers to be conducted through the temporary material layer 700 and the metal growing film 800. Material of the temporary material layer is the same with that in the aforesaid embodiment. The repeated description is omitted here.

Specifically, the other specific details of the present invention applied for the broken line repair to the non display region belongs to prior art in this field, and the detail description is omitted, either.

In conclusion, the present invention provides the broken line repair method of the TFT substrate. The method first finds out a broken line in the TFT substrate and a position of a broken point on the broken line. Then, positions of the passivation layer intersecting with the broken line at two ends of the broken point are processed, respectively to expose a metal layer, where the broken line is. Then, a temporary material layer is covered on the passivation layer and the metal layer which is exposed at the two ends of the broken point. Finally, a metal growing film is formed on the temporary material layer to connect the broken line of the two ends of the broken point. With the temporary material layer, the issue of bad repair result due to the remain of the color resist layer and the folding of the passivation layer can be solved to promote the adhesion result and uniformity of the metal growing film, and reduce the risks of the broken lines and peeling off of the metal growing film to raise the broken line repair success ratio of the TFT substrate.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A broken line repair method of a TFT substrate, comprising steps of:
   step 1, providing a TFT substrate;
   wherein the TFT substrate comprises: a substrate, a first metal layer, which is patterned and located on the substrate, an insulation layer covering the substrate and the first metal layer, a second metal layer, which is patterned and located on the insulation layer, a passivation layer covering the insulation layer and the second metal layer;
   step 2, finding out a broken line in the TFT substrate and a position of a broken point on the broken line;
   step 3, processing positions of the passivation layer intersecting with the broken line at two ends of the broken point, respectively to expose a metal layer, where the broken line is, wherein the metal layer is one of the first metal layer and the second metal layer;
   step 4, covering a temporary material layer on the passivation layer and the metal layer which is exposed at the two ends of the broken point;
   step 5, forming a metal growing film on the temporary material layer to connect the broken line of the two ends of the broken point;
   wherein material of the temporary material layer in the step 4 is resin acid material; and
   wherein material of the temporary material layer in the step 4 is $C_{19}H_{29}COOH$, and the temporary material layer constantly gasified along with formation of the metal growing film.

2. The broken line repair method of the TFT substrate according to claim 1, wherein the step 4 specifically comprises: delivering the TFT substrate to a temporary material station to form the temporary material layer on the passivation layer and the metal layer.

3. The broken line repair method of the TFT substrate according to claim 1, wherein
   the TFT substrate further comprises a color resist layer located on the passivation layer;
   in the step 3, removing a portion of the color resist layer in an adjacent region of the broken point to form a color resist groove which can connect the two ends of the broken point on the broken line, and the color resist groove exposes the passivation layer under the color resist layer; processing the positions of the passivation layer intersecting with the broken line at the two ends of the broken point, respectively to expose the metal layer, where the broken line is;

the broken line repair method of the TFT substrate further comprises step 6, performing dark point process to a sub pixel region having the color resist groove.

4. The broken line repair method of the TFT substrate according to claim 3, wherein in the step 4, covering the passivation layer and the metal layer exposed at the two ends of the broken point inside the color resist groove with the temporary material layer.

5. The broken line repair method of the TFT substrate according to claim 3, wherein specific steps of the dark point process in the step 6 are:

step 61, cutting a storage capacitor electrode line intersecting with the metal growing film in space to cut a connection between a source of the sub pixel region which needs the dark point process and the data line or a connection between a drain and a pixel electrode;

step 62, welding together the pixel electrode and the storage capacitor electrode line of the sub pixel region which needs the dark point process.

6. A broken line repair method of a TFT substrate, comprising steps of:

step 1, providing a TFT substrate;

wherein the TFT substrate comprises: a substrate, a first metal layer, which is patterned and located on the substrate, an insulation layer covering the substrate and the first metal layer, a second metal layer, which is patterned and located on the insulation layer, a passivation layer covering the insulation layer and the second metal layer;

step 2, finding out a broken line in the TFT substrate and a position of a broken point on the broken line;

step 3, processing positions of the passivation layer intersecting with the broken line at two ends of the broken point, respectively to expose a metal layer, where the broken line is, wherein the metal layer is one of the first metal layer and the second metal layer;

step 4, covering a temporary material layer on the passivation layer and the metal layer which is exposed at the two ends of the broken point;

step 5, forming a metal growing film on the temporary material layer to connect the broken line of the two ends of the broken point;

wherein the step 2 specifically comprises: putting the TFT substrate in an array test station for detection to find out the broken line in the TFT substrate and a position coordinate of the broken point on the broken line, and recording the coordinate of the broken point;

wherein the step 3 specifically comprises: delivering the TFT substrate to a repair machine, and the repair machine finds the corresponding broken point according to the coordinate of the broken point; then processing the positions of the passivation layer intersecting with the broken line at two ends of the broken point by laser welding to expose the metal layer; and wherein the TFT substrate further comprises a color resist layer located on the passivation layer;

in the step 3, removing a portion of the color resist layer in an adjacent region of the broken point to form a color resist groove which can connect the two ends of the broken point on the broken line, and the color resist groove exposes the passivation layer under the color resist layer; processing the positions of the passivation layer intersecting with the broken line at the two ends of the broken point, respectively to expose the metal layer, where the broken line is;

the broken line repair method of the TFT substrate further comprises step 6, performing dark point process to a sub pixel region having the color resist groove.

7. The broken line repair method of a TFT substrate according to claim 6, wherein material of the temporary material layer in the step 4 is chromium, cadmium or tin.

8. The broken line repair method of a TFT substrate according to claim 6, wherein material of the temporary material layer in the step 4 is resin acid material.

9. The broken line repair method of a TFT substrate according to claim 8, wherein material of the temporary material layer in the step 4 is $C_{19}H_{29}COOH$, and the temporary material layer constantly gasified along with formation of the metal growing film.

10. The broken line repair method of a TFT substrate according to claim 6, wherein the step 4 specifically comprises: delivering the TFT substrate to a temporary material station to form the temporary material layer on the passivation layer and the metal layer.

11. The broken line repair method of the TFT substrate according to claim 6, wherein in the step 4, covering the passivation layer and the metal layer exposed at the two ends of the broken point inside the color resist groove with the temporary material layer.

12. The broken line repair method of the TFT substrate according to claim 6, wherein specific steps of the dark point process in the step 6 are:

step 61, cutting a storage capacitor electrode line intersecting with the metal growing film in space to cut a connection between a source of the sub pixel region which needs the dark point process and the data line or a connection between a drain and a pixel electrode;

step 62, welding together the pixel electrode and the storage capacitor electrode line of the sub pixel region which needs the dark point process.

13. A broken line repair method of a TFT substrate, comprising steps of:

step 1, providing a TFT substrate;

wherein the TFT substrate comprises: a substrate, a first metal layer, which is patterned and located on the substrate, an insulation layer covering the substrate and the first metal layer, a second metal layer, which is patterned and located on the insulation layer, a passivation layer covering the insulation layer and the second metal layer;

step 2, finding out a broken line in the TFT substrate and a position of a broken point on the broken line;

step 3, processing positions of the passivation layer intersecting with the broken line at two ends of the broken point, respectively to expose a metal layer, where the broken line is, wherein the metal layer is one of the first metal layer and the second metal layer;

step 4, covering a temporary material layer on the passivation layer and the metal layer which is exposed at the two ends of the broken point;

step 5, forming a metal growing film on the temporary material layer to connect the broken line of the two ends of the broken point;

wherein the TFT substrate further comprises a color resist layer located on the passivation layer;

in the step 3, removing a portion of the color resist layer in an adjacent region of the broken point to form a color resist groove which can connect the two ends of the broken point on the broken line, and the color resist groove exposes the passivation layer under the color resist layer; processing the positions of the passivation layer intersecting with the broken line at the two ends of the broken point, respectively to expose the metal layer, where the broken line is;

the broken line repair method of the TFT substrate further comprises step 6, performing dark point process to a sub pixel region having the color resist groove.

14. The broken line repair method of the TFT substrate according to claim 13, wherein in the step 4, covering the passivation layer and the metal layer exposed at the two ends of the broken point inside the color resist groove with the temporary material layer.

15. The broken line repair method of the TFT substrate according to claim 13, wherein specific steps of the dark point process in the step 6 are:

step 61, cutting a storage capacitor electrode line intersecting with the metal growing film in space to cut a connection between a source of the sub pixel region which needs the dark point process and the data line or a connection between a drain and a pixel electrode;

step 62, welding together the pixel electrode and the storage capacitor electrode line of the sub pixel region which needs the dark point process.

16. The broken line repair method of the TFT substrate according to claim 13, wherein material of the temporary material layer in the step 4 is chromium, cadmium or tin.

17. The broken line repair method of the TFT substrate according to claim 13, wherein the step 4 specifically comprises: delivering the TFT substrate to a temporary material station to form the temporary material layer on the passivation layer and the metal layer.

18. The broken line repair method of the TFT substrate according to claim 17, wherein material of the temporary material layer in the step 4 is $C_{19}H_{29}COOH$, and the temporary material layer constantly gasified along with formation of the metal growing film.

* * * * *